United States Patent
Frost et al.

(10) Patent No.: US 11,075,169 B2
(45) Date of Patent: Jul. 27, 2021

(54) INTEGRATED-CIRCUITRY OVERLAY ALIGNMENT MARK, A SUBSTRATE COMPRISING AN OVERLAY ALIGNMENT MARK, A METHOD OF FORMING AN OVERLAY ALIGNMENT MARK IN THE FABRICATION OF INTEGRATED CIRCUITRY, AND A METHOD OF DETERMINING OVERLAY ALIGNMENT IN THE FABRICATION OF INTEGRATED CIRCUITRY

(71) Applicant: Micron Technology, Inc., Boise, ID (US)

(72) Inventors: Denzil S. Frost, Boise, ID (US); Richard T. Housley, Boise, ID (US); Jianming Zhou, Liaoning (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/226,074

(22) Filed: Dec. 19, 2018

(65) Prior Publication Data

US 2020/0203284 A1      Jun. 25, 2020

(51) Int. Cl.
  *H01L 23/544* (2006.01)
(52) U.S. Cl.
  CPC .... *H01L 23/544* (2013.01); *H01L 2223/5446* (2013.01); *H01L 2223/54426* (2013.01)
(58) Field of Classification Search
  CPC ......... H01L 23/544; H01L 2223/54426; H01L 2224/0213; H01L 2224/0217; H01L 2224/0224; H01L 2224/2499–24998; H01L 2224/26135; H01L 2224/26165; H01L 2224/40993; H01L 2224/40998; H01L 2224/777–77756;
  (Continued)

(56) References Cited

U.S. PATENT DOCUMENTS

| 5,949,145 A * | 9/1999 | Komuro ............... G03F 7/70633 |
| | | 257/797 |
| 9,881,972 B2 | 1/2018 | Frost et al. |

(Continued)

OTHER PUBLICATIONS

Wikipedia, "Overlay control", available online at: https://en.wikipedia.org/wiki/Overlay_control, p. 1.
(Continued)

*Primary Examiner* — Vincent Wall
(74) *Attorney, Agent, or Firm* — Wells St. John P.S.

(57) ABSTRACT

A method of forming an overlay alignment mark in the fabrication of integrated circuitry comprises forming a first series of periodically-horizontally-spaced lower first features on a substrate. A second series of periodically-horizontally-spaced upper second features is formed directly above the first series of the lower first features. Individual of the upper second features are directly above and cover at least a portion of individual of the lower first features in a first horizontal area of the substrate. Individual of the upper second features are not directly above and are not covering any portion of the individual lower first features in a second horizontal area of the substrate that is horizontally adjacent the first horizontal area. Other methods, and structure independent of method, are disclosed.

25 Claims, 13 Drawing Sheets

(58) Field of Classification Search
CPC ... H01L 2224/4899; H01L 2224/48993; H01L 2021/60067–6009; H01L 2021/10135; H01L 2021/10165; H01L 2223/5442–26; B81C 99/007; G03F 7/70633; G03F 7/7068

See application file for complete search history.

(56) References Cited

U.S. PATENT DOCUMENTS

| | | | |
|---|---|---|---|
| 10,811,362 B2* | 10/2020 | Cheng | H01L 23/544 |
| 2002/0127483 A1* | 9/2002 | Baek | G03F 7/70633 |
| | | | 430/22 |
| 2003/0042579 A1* | 3/2003 | Schulz | G01N 21/95607 |
| | | | 257/629 |
| 2005/0122516 A1* | 6/2005 | Sezginer | G03F 7/70633 |
| | | | 356/401 |
| 2005/0272221 A1* | 12/2005 | Yen | H01L 23/544 |
| | | | 438/401 |
| 2006/0043615 A1* | 3/2006 | Zheng | G03F 9/7076 |
| | | | 257/797 |
| 2007/0076205 A1* | 4/2007 | Schulz | G03F 7/70633 |
| | | | 356/401 |
| 2016/0064296 A1* | 3/2016 | Suzumura | H01L 22/34 |
| | | | 257/48 |

OTHER PUBLICATIONS

Wikipedia, "Spacer patterning", available online at: https://en.wikipedia.org/wiki/Spacer-patterning, pp. 1-2.

* cited by examiner

INTEGRATED-CIRCUITRY OVERLAY ALIGNMENT MARK, A SUBSTRATE COMPRISING AN OVERLAY ALIGNMENT MARK, A METHOD OF FORMING AN OVERLAY ALIGNMENT MARK IN THE FABRICATION OF INTEGRATED CIRCUITRY, AND A METHOD OF DETERMINING OVERLAY ALIGNMENT IN THE FABRICATION OF INTEGRATED CIRCUITRY

TECHNICAL FIELD

Embodiments disclosed herein pertain to integrated-circuitry overlay alignment marks, to substrates comprising an overlay alignment mark, to methods of forming an overlay alignment mark in the fabrication of integrated circuitry, and to methods of determining overlay alignment in the fabrication of integrated circuitry.

BACKGROUND

Integrated circuitry is typically manufactured in a sequence of patterning steps, with some individual of the steps placing a pattern of material above a substrate such as a semiconductor wafer. Thereby, electronic components of the circuitry (transistors, capacitors, conductive vias, diodes, etc.) made of various materials are deposited onto the substrate in layers and patterned in individual or multiple layers at a time. The separate patterning of one or more layers at a time relative to an underlying layer or layers needs to be aligned correctly relative one another.

Overlay control is a common term used that defines the control of this pattern-to-pattern alignment of elevationally different layers relative to one another. Misalignment of sufficient degree of one or more upper layers relative to lower layers can result in a failed or inoperative finished construction which impacts yield and profit margin for the manufacturer. Overlay alignment marks (e.g., box-in-box constructions) can be used to compare alignment of a higher level of features relative to a lower level of features.

DETAILED DESCRIPTION OF EXAMPLE EMBODIMENTS

Embodiments of the invention encompass a method of forming an overlay alignment mark in the fabrication of integrated circuitry and a method of determining overlay alignment in the fabrication of integrated circuitry. The invention also includes an integrated-circuitry overlay alignment mark and a substrate comprising an overlay alignment mark independent of method of fabrication.

Figure 1:
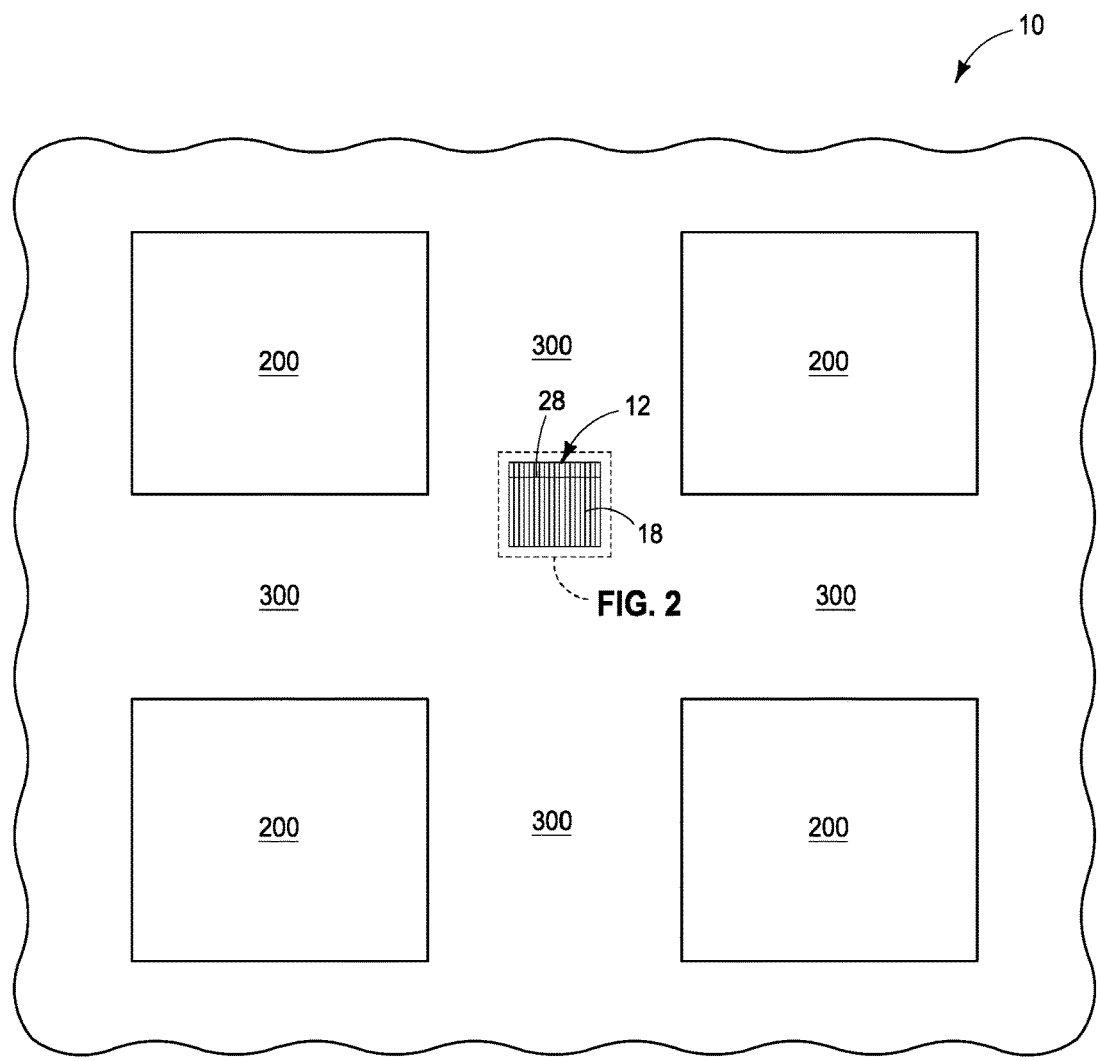
FIG. 1 is a diagrammatic top plan view of a portion of a construction in accordance with some embodiments of the invention

One example such substrate and alignment mark are initially and generally described with reference to FIGS. 1 and 2 which show only a small portion of a substrate construction 10. Such comprises a plurality of integrated-circuit dies 200 having scribe-line area 300 between immediately-adjacent of such dies. An overlay alignment mark diagrammatically indicated with reference numeral 12 has been formed in scribe-line area 300. Conventional processing relative to example substrate construction 10 would ultimately include cutting/singulating individual dies 200 into separate integrated circuit chips comprising an individual die 200 and that would thereby cut through and destroy scribe-line area 300 and any circuitry (e.g., test circuitry), alignment mark(s), and any other structures within scribe-line area 300. Alternate constructions of a substrate comprising integrated circuitry are of course contemplated, and whether existing or future-developed. For example, and by way of example only, a substrate construction may not comprise individual dies 200 that are spaced relative to one another by scribe-line area. For example, integrated circuitry may be fabricated largely continuously over a large substrate (e.g., wafer-scale integration) such that there essentially is no scribe-line area and no laterally-spaced dies. Regardless, some or all of an overlay alignment mark may be fabricated within or remain as part of an area of integrated circuitry in a finished integrated circuit construction.

Figure 2:
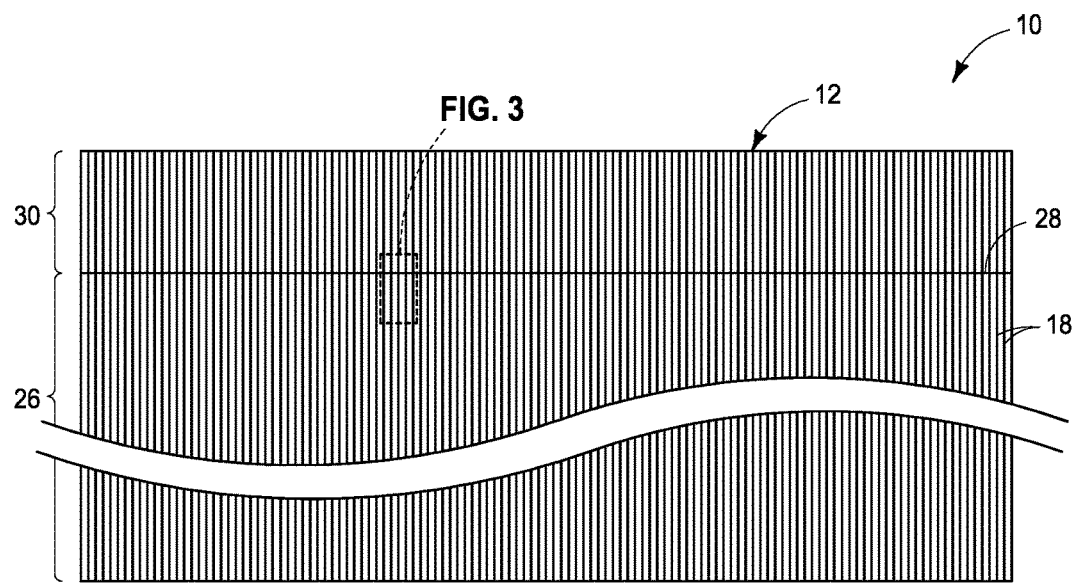
FIG. 2 is a diagrammatic enlarged view of portion of FIG. 1.
Figure 3:
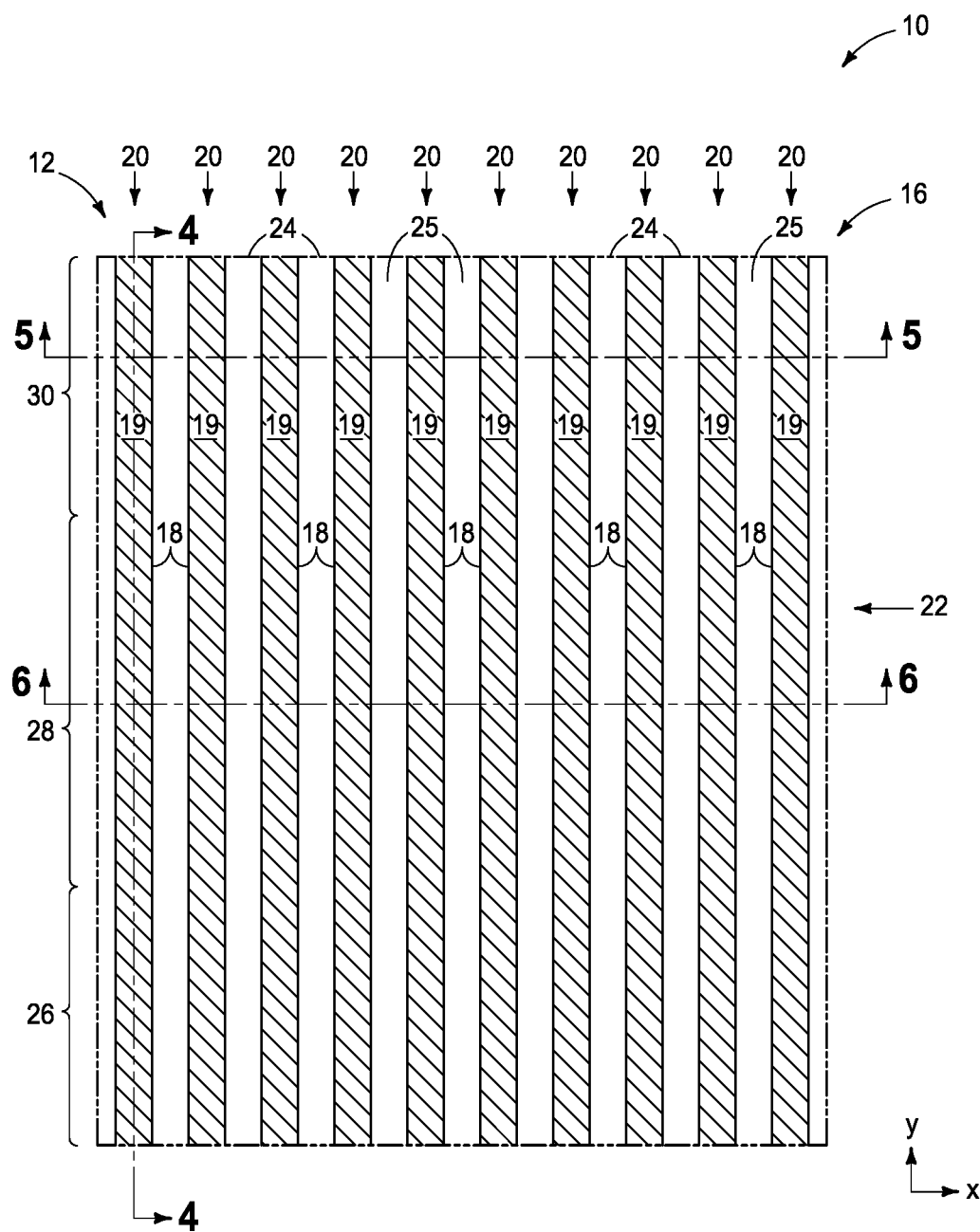
FIG. 3 is a diagrammatic cross-sectional view of a portion of a construction in process in accordance with some embodiments of the invention and is taken through line 3-3 in FIGS. 4-6.

FIG. 2 is a diagrammatic enlargement of overlay alignment mark 12 of FIG. 1 and is diagrammatically intended to show a finished construction of an overlay alignment mark in accordance with either a method of fabrication as described below and as well an overlay alignment mark independent of method of fabrication. However, the discussion proceeds starting with FIGS. 3-6 of an overlay alignment mark 12 in a method of fabrication wherein FIG. 3 is an even further enlargement of only a portion of FIG. 2 in the description of such a method. Numeric identifiers 26, 30, 38 and 42, first utilized in FIG. 2, are included in the discussion of FIG. 3 below.

Figure 4:
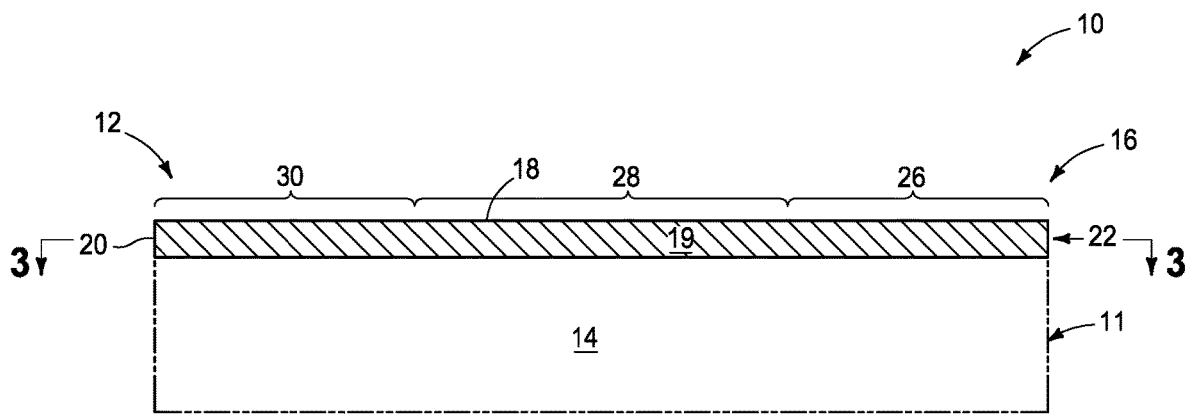
FIG. 4 is a view taken through line 4-4 in FIG. 3.
Figure 5:
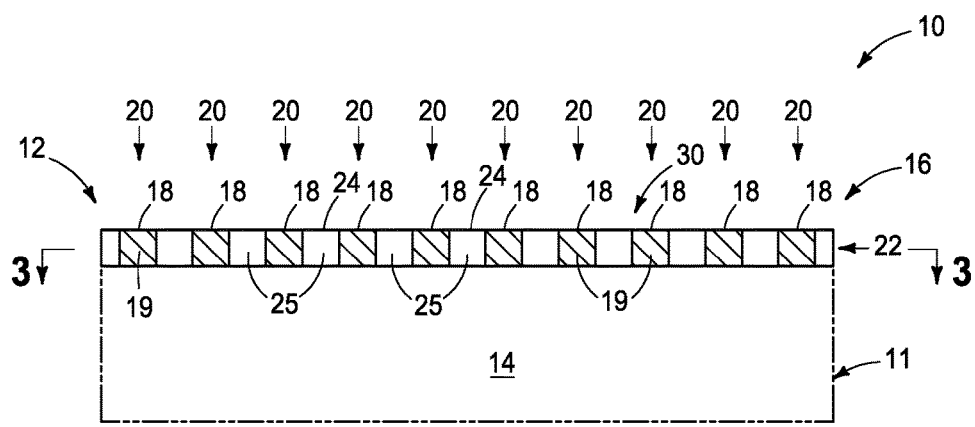
FIG. 5 is a view taken through line 5-5 in FIG. 3.
Figure 6:
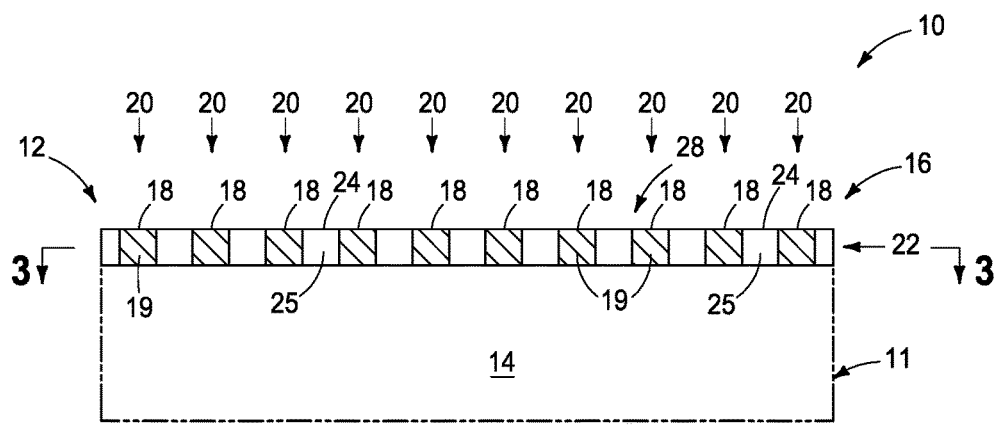
FIG. 6 is a view taken through line 6-6 in FIG. 3.

FIGS. 3-6 show an initial portion of overlay alignment mark 12 in fabrication that is over a base substrate 11 which may comprise any one or more of conductive/conductor/conducting, semiconductive/semiconductor/semiconducting, or insulative/insulator/insulating (i.e., electrically herein) material(s) 14 (see FIG. 4). Materials may be aside, elevationally inward, or elevationally outward of the FIGS. 3-6—depicted materials. A first series 16 of periodically-horizontally-spaced lower first features 18 has been formed on substrate 11, and in one embodiment commonly within a level or tier 22. In the context of this document, a "feature" is any construction that is discernible relative to a laterally-adjacent construction (e.g., a different feature) either visually and/or by existing or future-developed metrology equipment used to determine overlay control and alignment of upper features and lower features relative to one another. In one embodiment and as shown, lower first features 18 have been formed to be in respective lines 20 which in one embodiment and as shown are straight. Example individual lower first features 18 are also shown to be continuous lines of material 19 which in one embodiment is conductive, although insulative or semiconductive materials may also be used.

For purposes of the continuing discussion, example overlay alignment mark 12 may be considered as comprising a first horizontal area 26, a second horizontal area 28, and a third horizontal area 30 of substrate construction 10, with third horizontal area 30 being spaced from first horizontal area 26. In one embodiment and as shown, the first and second horizontal areas are immediately-horizontally-adjacent one another and the second and third horizontal areas are immediately-horizontally-adjacent one another, with "immediately-horizontally-adjacent" meaning that there is no other horizontal area there-between. In other words, an interface edge of immediately-horizontally-adjacent horizontal areas are coincident. Regardless, there may be no third horizontal area, for example with the second horizontal area being at one or more edges of the overlay alignment mark (not shown) as opposed to internally therein. Further, one or more of the horizontal areas may extend horizontally (e.g., in one of x-direction, y-direction, or diagonally) all across the overlay alignment mark or only across or only within a portion of the overlay alignment mark. Accordingly, and further considered, any one or more of the horizontal areas may be only a small portion of the overall overlay alignment mark.

Example lower first features 18 as formed in straight lines 20 are shown spaced relative one another by insulative material 25 which may be considered as features 24. Lower first features 18 may be formed by any existing or future-developed manner, for example including spacer patterning (not specifically shown) which may also be considered by persons of skill in the art as pitch multiplication. The discussion proceeds in fabrication of a second series of periodically-horizontally-spaced upper second features that are formed by spacer patterning as only an example. The second series of periodically-horizontally-spaced upper second features may be formed by any alternate or future-developed techniques.

Figure 7:
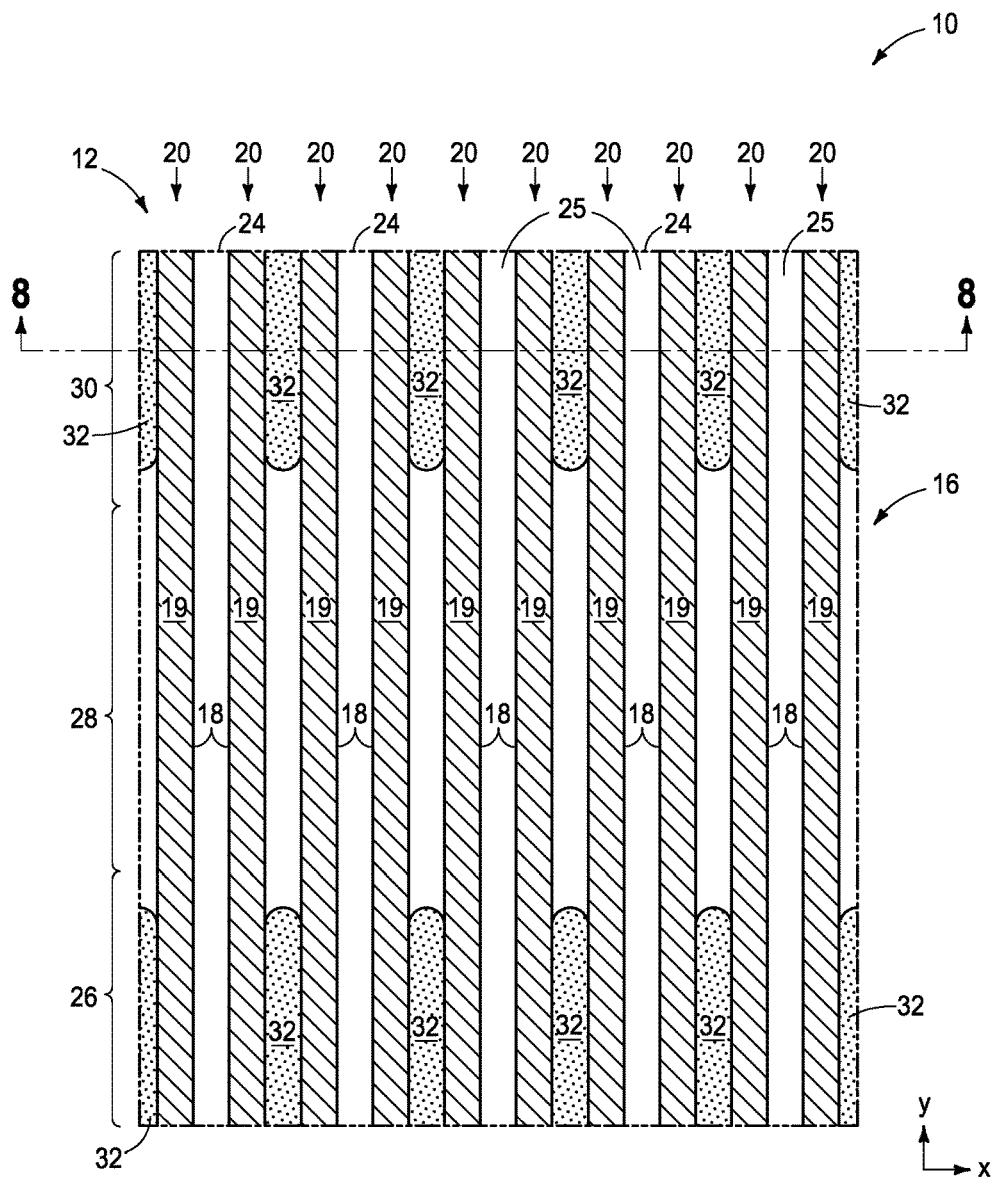
FIG. 7 is a downwardly-looking and cross-sectional view of the FIG. 3 construction at a processing step subsequent to that shown by FIG. 3 and is taken through line 7-7 in FIG. 8.
Figure 8:
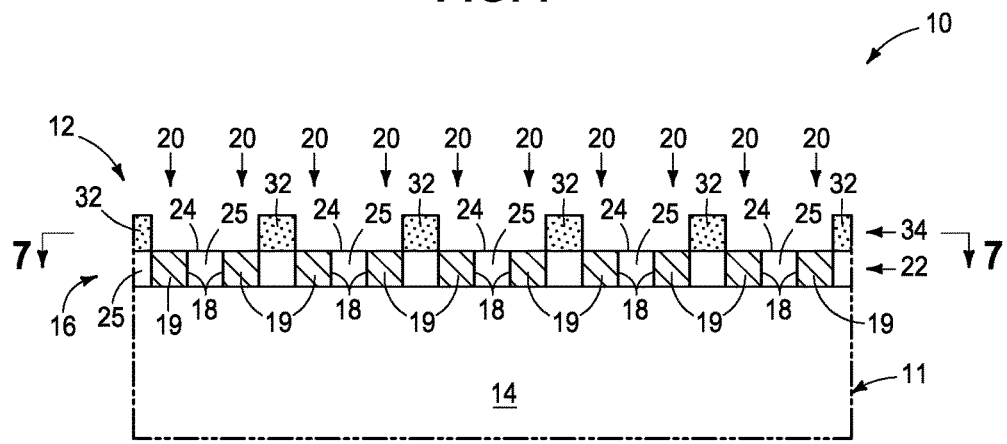
FIG. 8 is a view taken through line 8-8 in FIG. 7.
Figure 9:
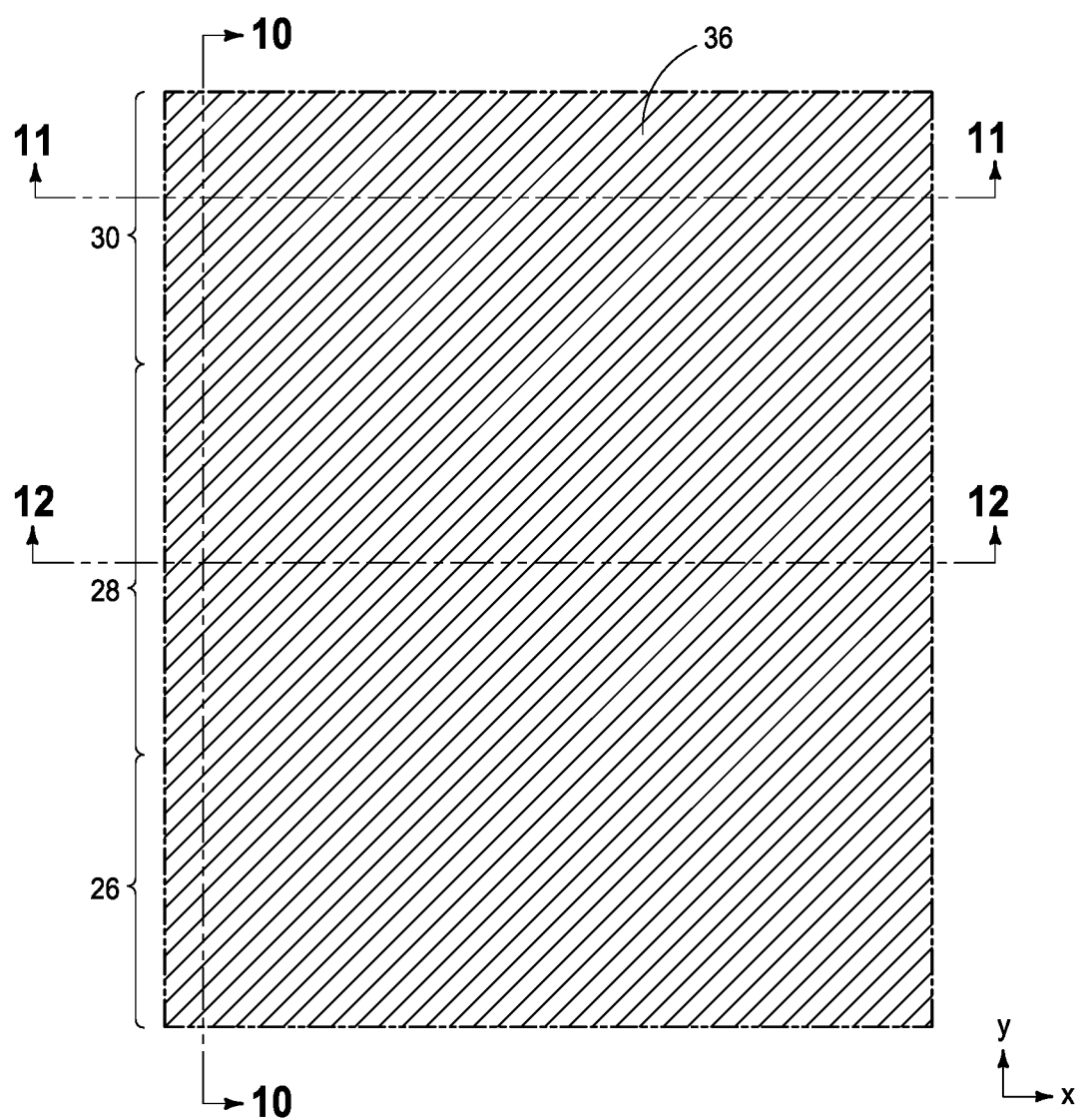
FIG. 9 is a view of the FIG. 7 construction at a processing step subsequent to that shown by FIG. 7 and is taken through line 9-9 in FIGS. 10 and 12.
Figure 10:
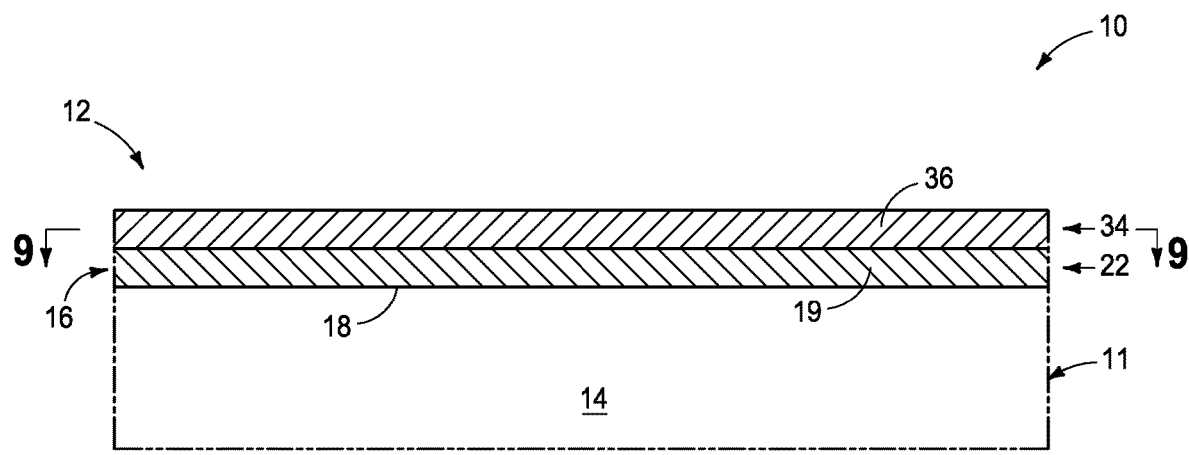
FIG. 10 is a view taken through line 10-10 in FIG. 9.
Figure 11:
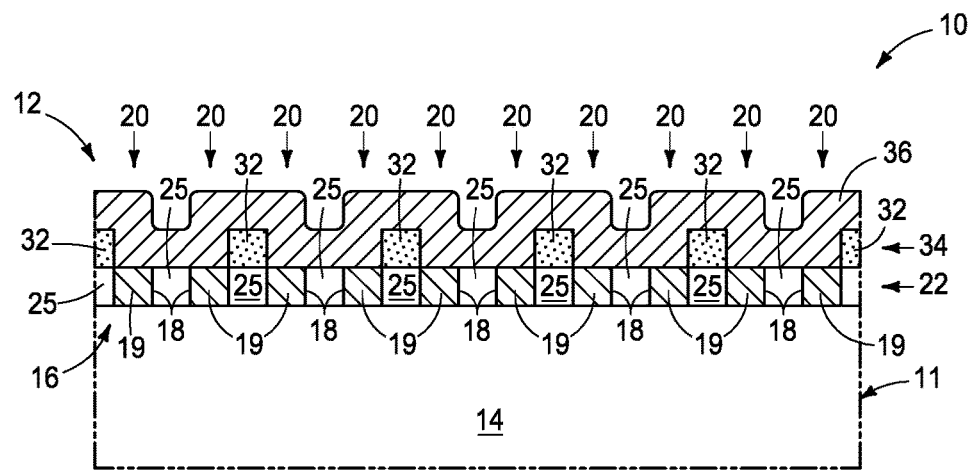
FIG. 11 is a view taken through line 11-11 in FIG. 9.
Figure 12:
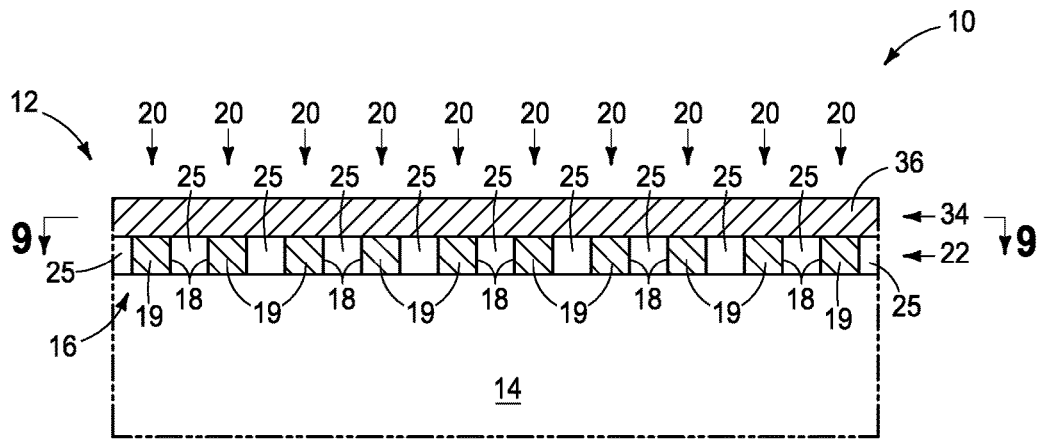
FIG. 12 is a view taken through line 12-12 in FIG. 9.

Referring to FIGS. 7 and 8, sacrificial masses 32 (e.g., mandrels; e.g., comprising photoresist) have been formed atop the FIGS. 3-6 construction in example first and third horizontal areas 26 and 30, respectively, but not in second horizontal area 28. In one embodiment, sacrificial masses 32 are commonly received within a level or tier 34 that is above level 22.

Figure 13:
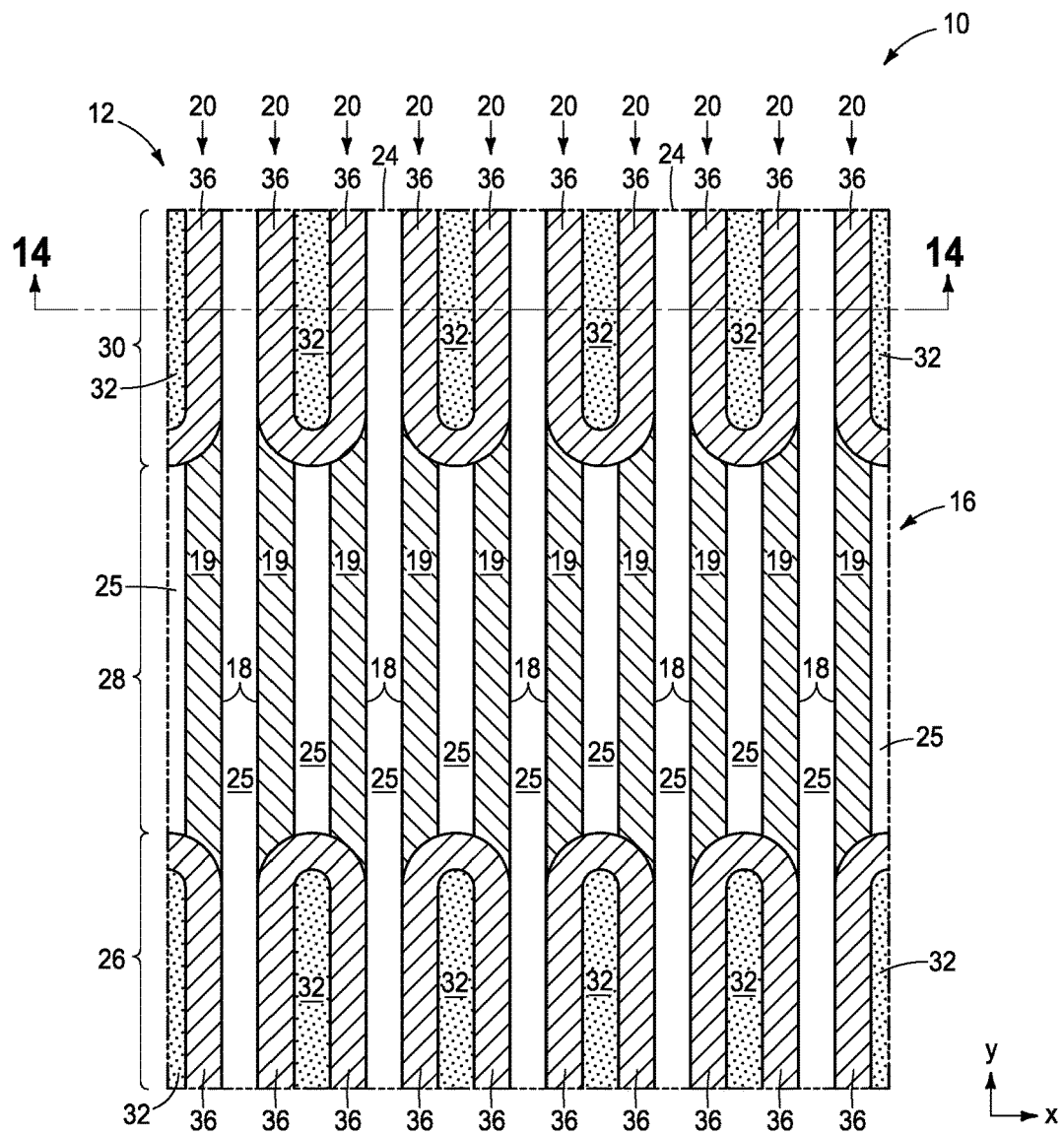
FIG. 13 is a downwardly-looking and cross-sectional view of the FIG. 9 construction at a processing step subsequent to that shown by FIG. 9 and is taken through line 13-13 in FIG. 14.
Figure 14:
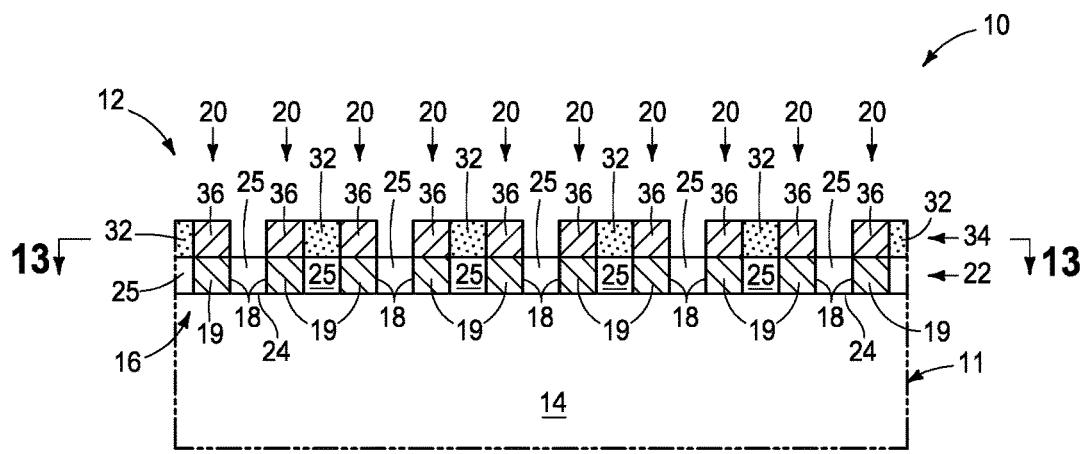
FIG. 14 is a view taken through line 14-14 in FIG. 13.

Referring to FIGS. 9-12, conductive material 36 has been formed atop and as part of level 34. FIGS. 13 and 14 show conductive material 36 as having been anisotropically etched back (e.g., spacer patterning) to remove such from being atop sacrificial masses 32 and material 25. FIGS. 15-18 show selective removal of sacrificial masses 32 (not shown) relative to conductive material 36 and insulative material 25.

The FIGS. 7-18 processing has resulted in, and in but one example embodiment is an example of, forming of a second series 40 of periodically-horizontally-spaced upper second features 42 directly above first series 16 of lower first features 18. Individual of upper second features 42 are directly above and cover at least a portion of individual lower first features 18 in first horizontal area 26 and in one embodiment and as shown also in third horizontal area 30. Individual upper second features 42 are not directly above and do not cover any portion of individual lower first features 18 in second horizontal area 28.

In one embodiment and as shown, upper second features 42 are formed in respective lines 46 which in one embodiment as shown are straight. Additionally, and in one embodiment, individual upper second features 42 are shown to be continuous lines of material 36 which, in one embodiment, is conductive. Regardless, insulative or other material (not shown) may be between upper second features 42 analogous to material 25 that is between lower first features 18. In one embodiment and as shown, each of first series 16 and second series 40 is horizontally elongated (e.g., in the y-direction as appearing in FIG. 15). Further and regardless, in one embodiment, the above described processing shows forming both of (a) upper second features 42 in their respective straight lines 46 in first horizontal area 26, and (b) lower first features 18 in their respective straight lines 20 in both first horizontal area 26 and second horizontal area 28 to be continuous.

Any other attribute(s) or aspect(s) as shown and/or described herein with respect to other embodiments may be used with respect to the above-described embodiments.

Figure 15:
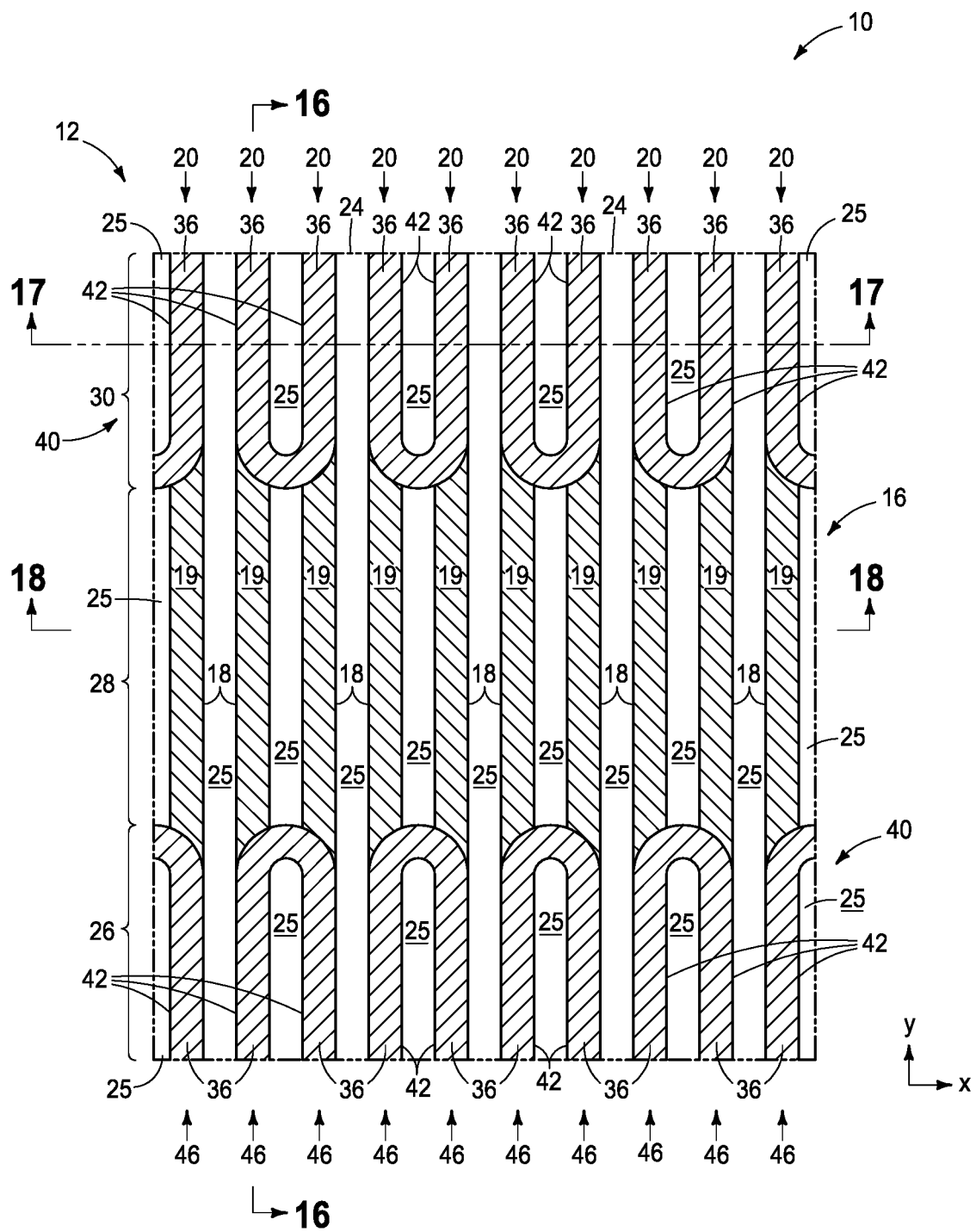
FIG. 15 is a downwardly-looking and cross-sectional view of the FIG. 13 construction at a processing step subsequent to that shown by FIG. 13 and is taken through line 15-15 in FIGS. 16-18.
Figure 16:
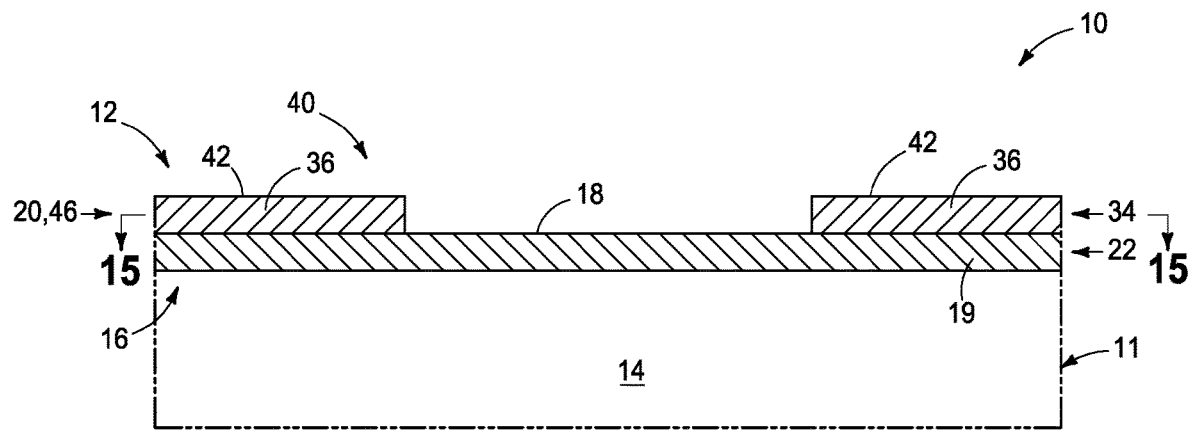
FIG. 16 is a view taken through line 16-16 in FIG. 15.
Figure 17:
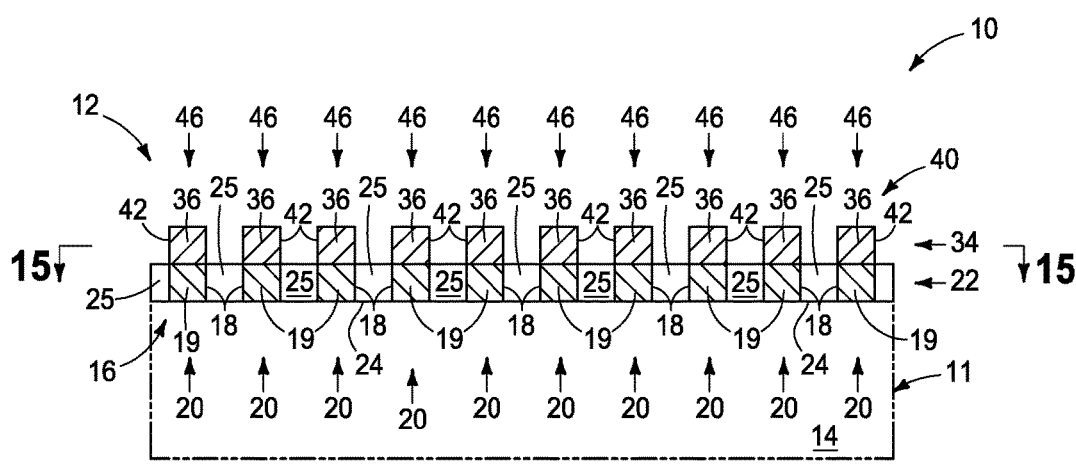
FIG. 17 is a view taken through line 17-17 in FIG. 15.
Figure 18:
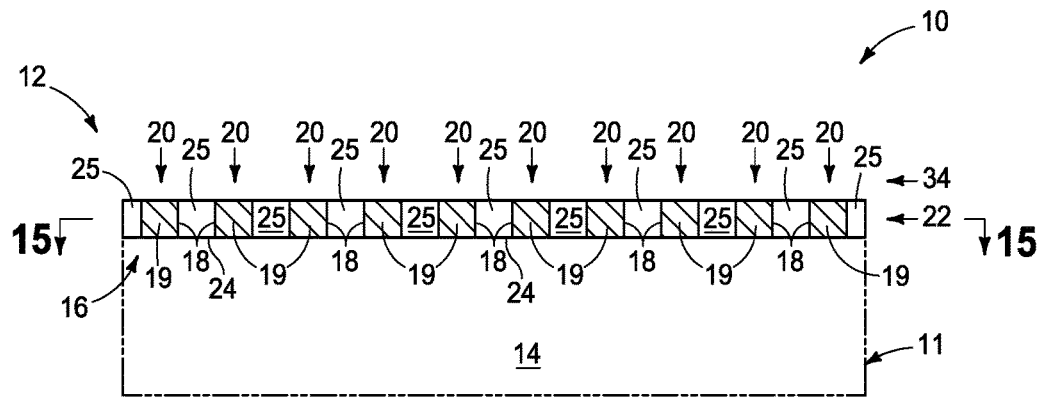
FIG. 18 is a view taken through line 18-18 in FIG. 15.
Figure 19:
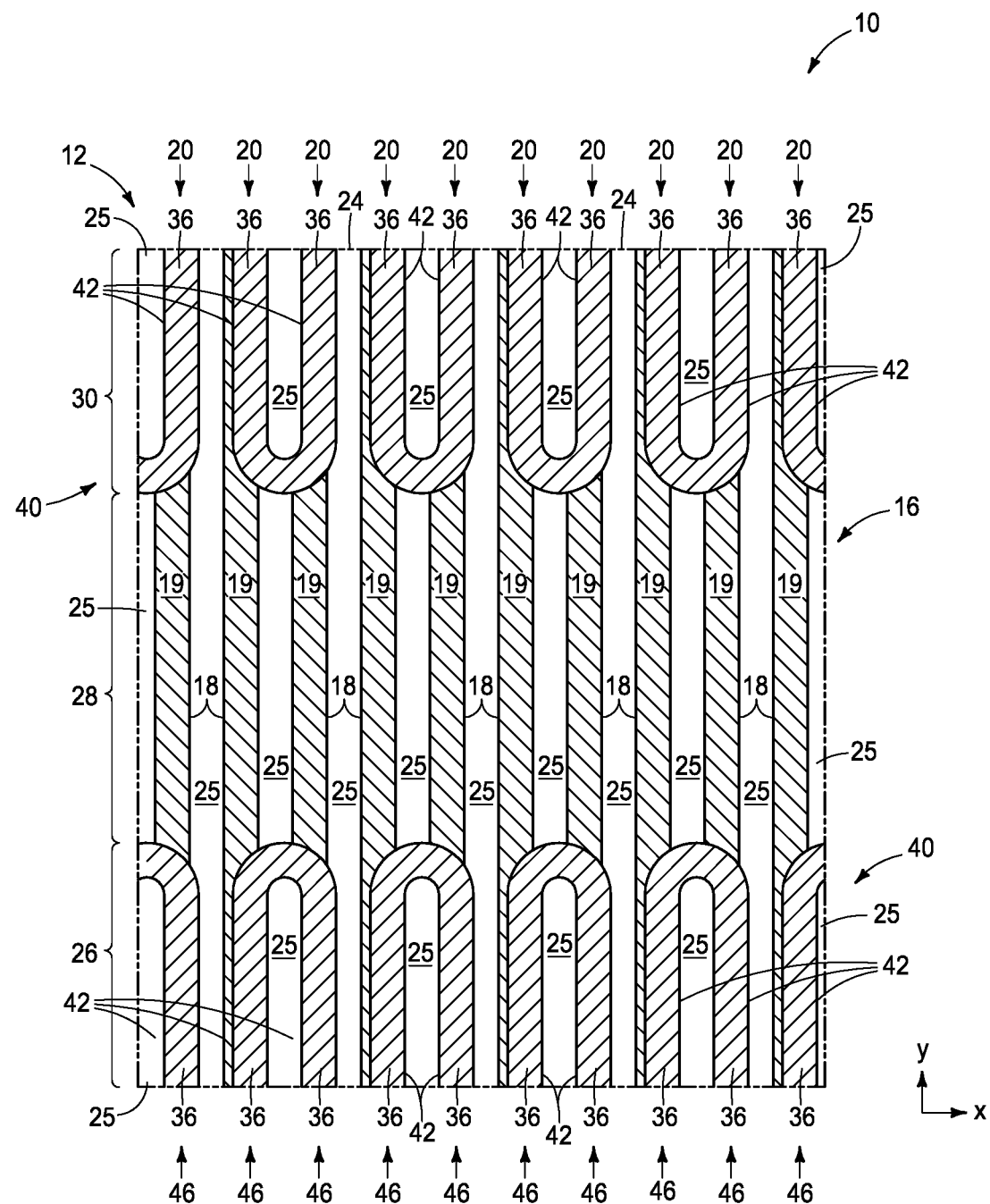
FIG. 19 is a downwardly-looking and cross-sectional view of an alternate embodiment to that shown by FIG. 15.

In one embodiment, individual upper second features 42 are formed to be of at least one of different size or shape (both of different size and shape as shown) from size or shape of individual lower first features 18. Although lower first features 18 and upper second features 42 as viewed in FIG. 15 are very similar to one another in size and shape, they are still of different size or shape as shown because of the rounded and interconnected ends of upper second features 42 immediately proximate second horizontal area 28. Alternately, and in one embodiment, the individual upper second features may be formed to be of the same size and shape (not shown in FIG. 15) as the individual lower first features (e.g., form the upper second features without rounded and interconnected ends, and not shown). Additionally, regardless, and by of example only, the above-described drawings depict perfect alignment of upper second features 42 relative to lower first features 18. FIG. 19 shows an alternate example construction 10 comprising an overlay alignment mark 12 wherein misalignment-to-the-right (in the x-direction) has occurred of second series 40 relative to first series 16.

The above described processings also are but example embodiments wherein individual upper second features 42 are never directly above and never cover any portion of individual lower first features in second horizontal area 28.

Alternately, but less preferred and by way of example only, the individual upper second features 42 could be initially formed to be directly above and cover (not shown) at least some portion of individual lower first features 18 in second horizontal area 28. Such initial forming could be followed by removing (e.g., by anisotropic etching using a mask, and not shown) all of individual upper second features 42 in second horizontal area 28 such that individual of the upper second features are not directly above and do not cover any portion of the individual lower first features in the second horizontal area. Any other attribute(s) or aspect(s) as shown and/or described herein with respect to other embodiments may be used.

Figure 20:
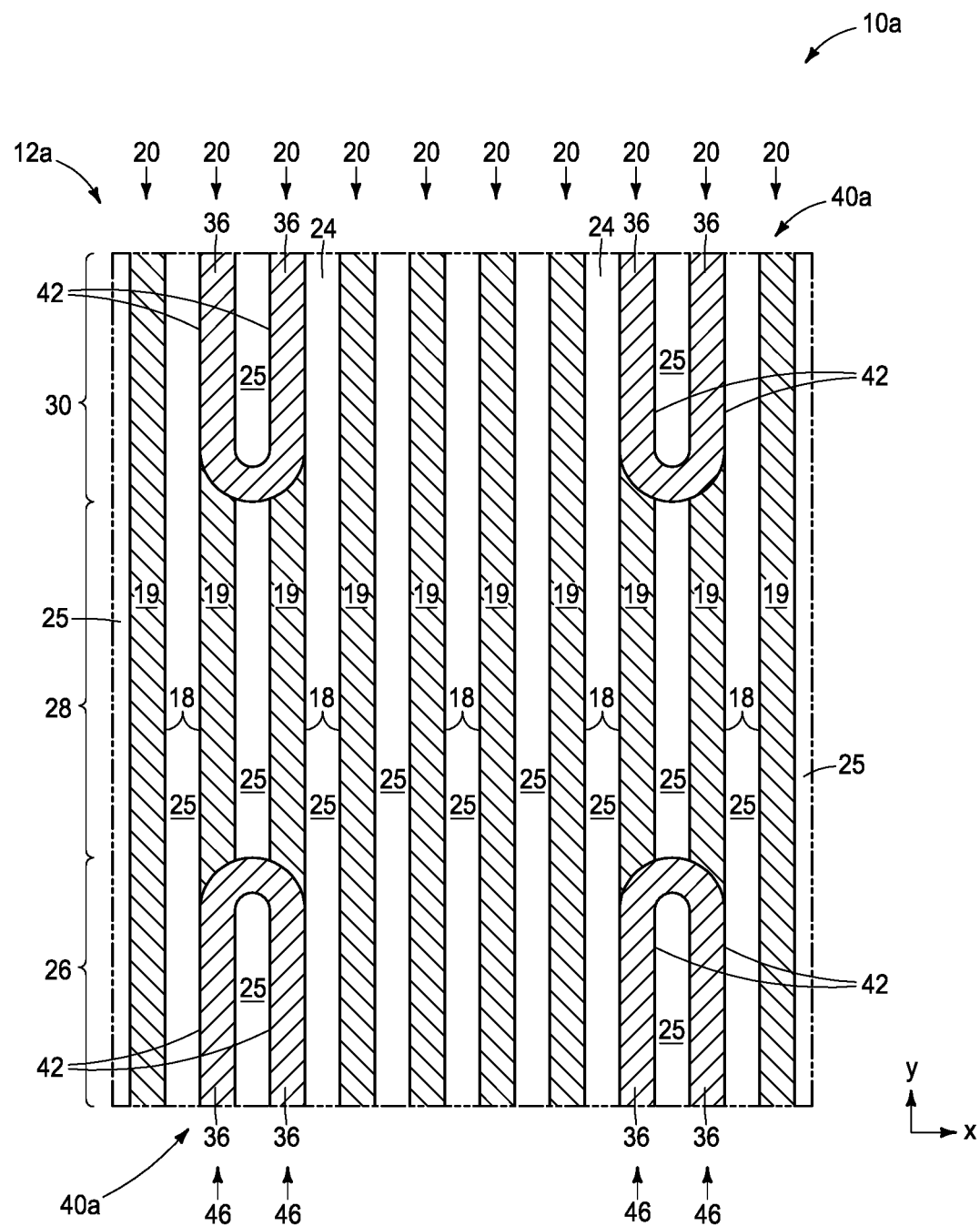
FIG. 20 is a downwardly-looking and cross-sectional view of an alternate embodiment to that shown by FIG. 15.

The above figures also show example embodiments wherein number of lower first features 18 and number of upper second features 42 have a one-to-one correspondence (i.e., there are the same number of lower first features as there are upper second features). Alternately, the number of the lower first features and the number of the upper second features do not have a one-to-one correspondence, for example as shown in FIG. 20 with respect to an overlay alignment mark 12*a* of a construction 10*a*. Like numeral from the above-described embodiments have been used where appropriate with some construction differences being indicated with the suffix "a". Example overlay alignment mark 12*a* has less second features 42 than first features 18. Any existing or future-developed relationship of number and layout of the second features relative to the first features in an overlay alignment mark may be used (e.g., one series may be formed in a nonius-like or vernier-like scale relative the other series). Any other attribute(s) or aspect(s) as shown and/or described herein with respect to other embodiments may be used.

Figure 21:
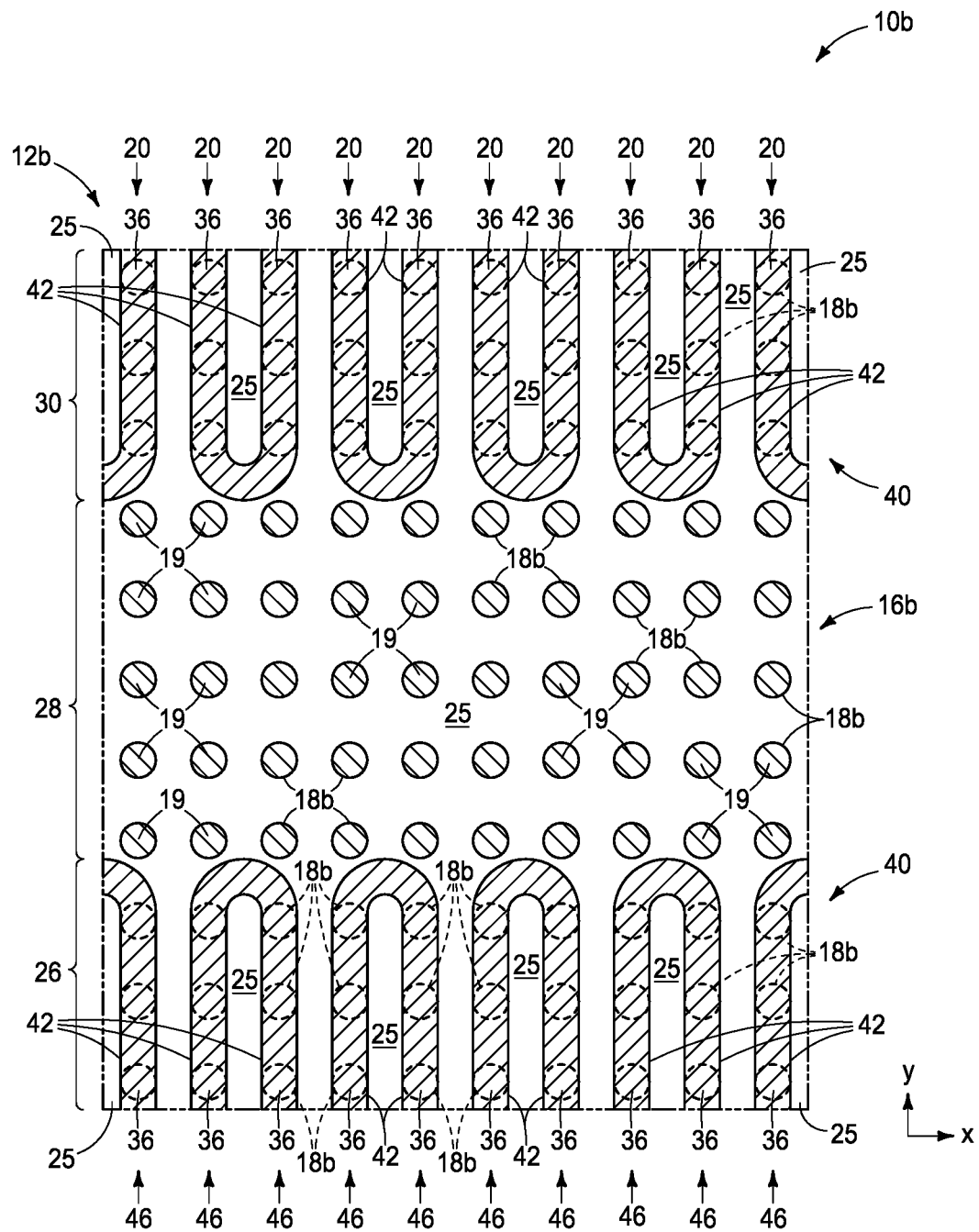
FIG. 21 is a downwardly-looking and cross-sectional view of an alternate embodiment to that shown by FIG. 15.

In one embodiment, at least one of (a) the upper second features in their respective straight lines, or (b) the lower first features in their respective straight lines are formed to be discontinuous, for example as is shown in FIG. 21 in an overlay alignment mark 12*b* of a construction 10*b*. Like numerals from the above-described embodiments have been used where appropriate, with some construction differences being indicated with the suffix "b" or with different numerals. Overlay alignment mark 12*b* has an example first series 16*b* having lower first features 18*b* formed in straight lines 20 as comprising example circular openings or vias 18*c*. Upper second features 42 are shown as being continuous lines of material as in the first-described embodiments, although lower first features 18 could be made as continuous lines of material and upper second features 42 could be formed to be discontinuous. Further, alternate discontinuous features other than openings or vias or other structures may of course be used. Regardless, FIG. 21 shows but one example embodiment wherein only one of (a) and (b) is formed to be discontinuous. Any other attribute(s) or aspect(s) as shown and/or described herein with respect to other embodiments may be used.

Figure 22:
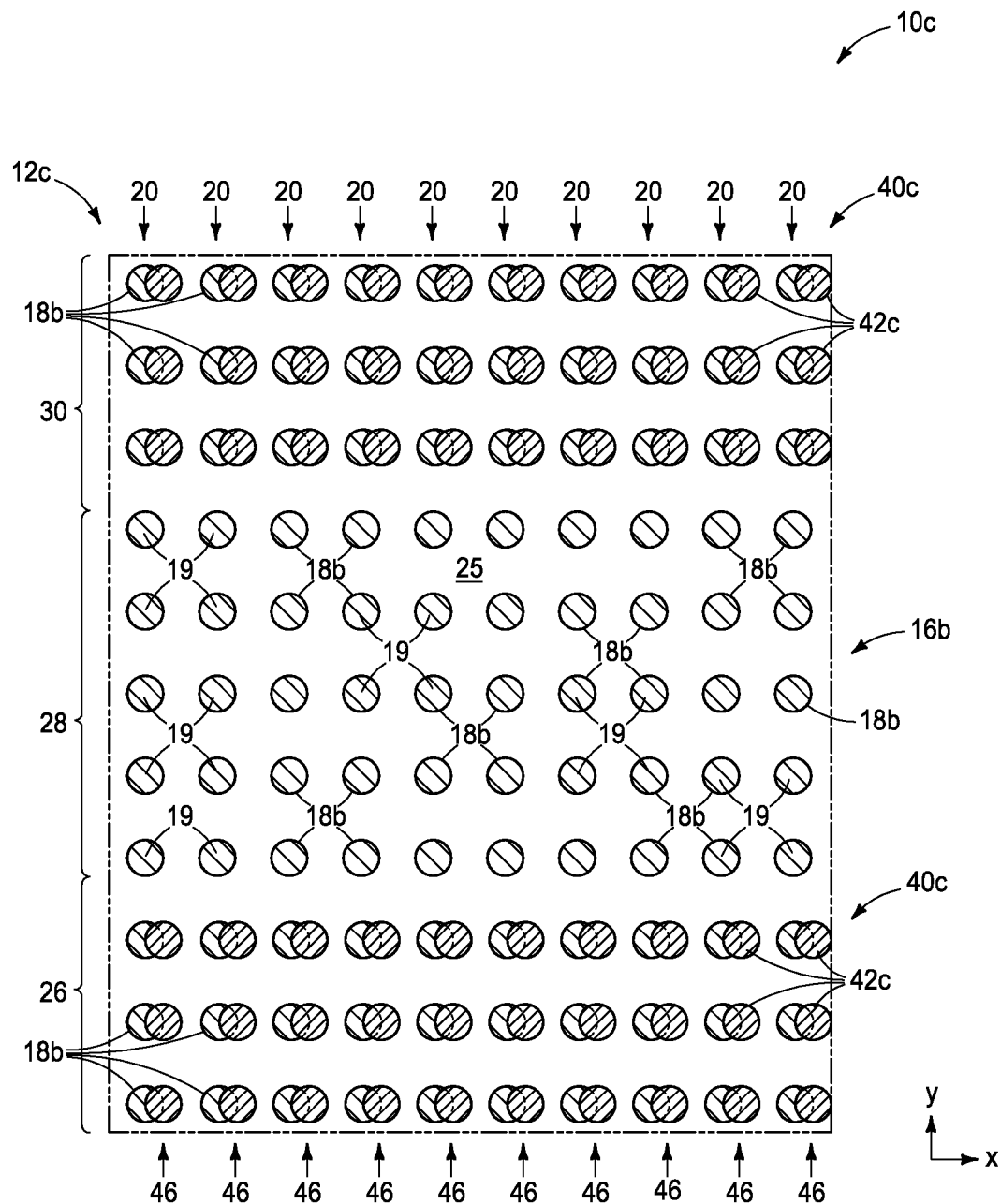
FIG. 22 is a downwardly-looking and cross-sectional view of an alternate embodiment to that shown by FIG. 15.

FIG. 22 shows an alternate embodiment construction 10*c* of an overlay alignment mark 12*c* wherein both of (a) and (b) are shown to be discontinuous. Like numerals from the above-described embodiments have been used where appropriate, with some construction differences being indicated with the suffix "c". FIG. 22 also at least for clarity shows an example wherein there is misalignment-to-the-right (in the x-direction) of upper second features 42*c* relative to lower first features 18*b*. Any other attribute(s) or aspect(s) as shown and/or described herein with respect to other embodiments may be used.

In an alternate embodiment, features 24 of material 25 in level 22 may alternately be the periodically-horizontally-spaced lower first features (as opposed to features 18 as described above), with individual periodically-horizontally-spaced upper second features being formed directly above and covering at least a portion of individual lower first features 24 (not shown) in the first horizontal area of the substrate. In one such embodiment, one of the materials of the continuous lines of the individual upper second features and the material of the continuous lines of the individual lower first features is conductive (e.g., 19) and the other is insulative (e.g., 25). Any other attribute(s) or aspect(s) as shown and/or described herein with respect to other embodiments may be used.

An embodiment of the invention encompasses a method of determining overlay alignment in the fabrication of integrated circuitry. Such a method comprises forming a first series (e.g., 16) of periodically-horizontally-spaced lower first features (e.g., 18) on a substrate (e.g., 11). A second series (e.g., 40, 40*a*, 40*c*) of periodically-horizontally-spaced upper second features (e.g., 42, 42*c*) is formed directly above the first series of the lower first features. Individual of the upper second features are directly above and cover at least a portion of individual of the lower first features in a first horizontal area (e.g., 26) of the substrate. Individual of the upper second features are not directly above and do not cover any portion of the individual lower first features in a second horizontal area (e.g., 28) of the substrate that is horizontally adjacent the first horizontal area. Such a method includes comparing horizontal alignment of the uncovered lower first features in the first horizontal area and the covering upper second features in the horizontally-adjacent second horizontal area relative to one another to determine overlay alignment of the upper second features relative to the lower first features. For example, and by way of example only, the sectional and downwardly looking views as shown in FIGS. 15, 19, 20, 21, and 22 of such constructions may be used visually or using metrology equipment to compare such horizontal alignment, with FIGS. 15, 20, and 21 by way of example showing perfect horizontal alignment and FIGS. 19 and 22 showing a degree of misalignment. Any other attribute(s) or aspect(s) as shown and/or described herein with respect to other embodiments may be used.

Embodiments of the invention encompass structures and/or devices independent of method of manufacture. Nevertheless, such structures and/or devices may have any of the attributes as described herein in method embodiments. Likewise, the above-described method embodiments may incorporate and form any of the attributes described with respect to structures and/or devices embodiments.

In one embodiment, an integrated circuitry overlay alignment mark (e.g., 12, 12*a*, 12*c*) comprises a first series (e.g., 16, 16*b*, 16*c*) of periodically-horizontally-spaced lower first features (e.g., 18, 18*b*) on a substrate (e.g., 11). A second series (e.g., 40, 40*a*, 40*c*) of periodically-horizontally-spaced upper second features (e.g., 42, 42*c*) is directly above the first series of the lower first features. Individual of the upper second features are directly above and cover at least a portion of individual of the lower first features in a first horizontal area (e.g., 26) of the substrate. Individual of the upper second features are not directly above and do not cover any portion of the individual lower first features in a second horizontal area (e.g., 28) of the substrate that is horizontally adjacent the first horizontal area. Any other attribute(s) or aspect(s) as shown and/or described herein with respect to other embodiments may be used.

In one embodiment, a substrate (e.g., 10) comprises a plurality of integrated circuit dies (e.g., 200) having scribe-line area (e.g., 300) between immediately-adjacent of the dies. An overlay alignment mark (e.g., 12, 12*a*, 12*c*) is in the scribe-line area and comprises a first series (e.g., 16, 16*b*, 16*c*) of periodically-horizontally-spaced lower first features (e.g., 18, 18*b*). The overlay alignment mark comprises a second series (e.g., 40, 40*a*, 40*c*) of periodically-horizontally-spaced second features (e.g., 42, 42*c*) directly above the first series of the lower first features. Individual of the upper second features are directly above and cover at least a portion of individual of the lower first features in a first horizontal area (e.g., 26). Individual of the upper second features are not directly above and do not cover any portion of the individual lower first features in a second area (e.g., 28) that is horizontally adjacent the first horizontal area. In one embodiment, the upper second features and the lower first features are in respective straight lines. In one embodiment, the upper second features and the lower first features are formed of material that is continuous in the respective straight lines. Any other attribute(s) or aspect(s) as shown and/or described herein with respect to other embodiments may be used.

In one embodiment, a substrate (e.g., 10) comprises a plurality of integrated circuit dies (e.g., 200) having scribe-line area (e.g., 300) between immediately-adjacent of the dies. The substrate comprises an overlay alignment mark (e.g., 12, 12*a*) in the scribe-line area comprising a first series (e.g., 16) of periodically-horizontally-spaced continuous first lines (e.g., 20). The overlay alignment mark comprises a second series (e.g., 40, 40*a*) of periodically-horizontally-spaced continuous second lines (e.g., 46) directly above the first series of the first lines. Individual of the second lines are directly above and cover at least a portion of individual of the first lines in horizontally-spaced areas (e.g., 26 and 30) of the scribe-line area. The overlay alignment mark comprises an intervening horizontal area (e.g., 28) between the horizontally-spaced areas. Individual of the second lines are not directly above and do not cover any portion of the individual first lines in the intervening second horizontal area. In one embodiment, the first and second lines are straight. Any other attribute(s) or aspect(s) as shown and/or described herein with respect to other embodiments may be used.

The methods and substrates as described and claimed herein may broadly be used in methods or found in structures of any existing or future-developed methods and constructions. In one embodiment, the determined overlay alignment of the upper second features relative to the lower first features determines overlay alignment of a plurality of immediately-vertically-adjacent and directly-electrically-coupled upper and lower conductive lines of the integrated circuitry that were formed at different times. In one such embodiment, the integrated circuitry comprises immediately-vertically-adjacent upper and lower decks individually comprising cross-point memory cells, with the plurality of upper conductive lines being lowest conductive lines in the upper deck of the cross-point memory cells and the plurality of the lower conductive lines being uppermost conductive lines in the lower deck of the cross-point memory cells. Further and in one embodiment, the lines in the overlay alignment mark may be of the same size, shape, and orientation as the upper second features and lower features in operative circuitry. See, for example, U.S. Pat. No. 9,881,972 to Frost et al. that issued on Jan. 30, 2018 that shows a construction of integrated circuitry comprising immediately-vertically-adjacent upper and lower decks individually comprising cross-point memory cells, and which is hereby fully incorporated by reference herein.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material acid/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method of forming an overlay alignment mark in the fabrication of integrated circuitry comprises forming a first series of periodically-horizontally-spaced lower first features on a substrate. A second series of periodically-horizontally-spaced upper second features is formed directly above the first series of the lower first features. Individual of the upper second features are directly above and cover at least a portion of individual of the lower first features in a first horizontal area of the substrate. Individual of the upper second features are not directly above and are not covering any portion of the individual lower first features in a second horizontal area of the substrate that is horizontally adjacent the first horizontal area.

In some embodiments, a method of determining overlay alignment in the fabrication of integrated circuitry comprises forming a first series of periodically-horizontally-spaced lower first features on a substrate. A second series of periodically-horizontally-spaced upper second features is formed directly above the first series of the lower first features. Individual of the upper second features are directly above and cover at least a portion of individual of the lower first features in a first horizontal area of the substrate. Individual of the upper second features are not directly above and are not covering any portion of the individual lower first features in a second horizontal area of the substrate that is horizontally adjacent the first horizontal area. Horizontal alignment of the uncovered lower first features in the first horizontal area and the covering upper second features in the horizontally-adjacent second horizontal area are compared relative to one another to determine overlay alignment of the upper second features relative to the lower first features.

In some embodiments, an integrated-circuitry overlay alignment mark comprises a first series of periodically-horizontally-spaced lower first features on a substrate. A second series of periodically-horizontally-spaced upper second features directly is above the first series of the lower first features. Individual of the upper second features are directly above and cover at least a portion of individual of the lower first features in a first horizontal area of the substrate. Individual of the upper second features are not directly above and are not covering any portion of the individual lower first features in a second horizontal area of the substrate that is horizontally adjacent the first horizontal area.

In some embodiments, a substrate comprises a plurality of integrated-circuit dies having scribe-line area between immediately-adjacent of the dies. An overlay alignment mark is in the scribe-line area and comprises a first series of periodically-horizontally-spaced lower first features. A second series of periodically-horizontally-spaced upper second features is directly above the first series of the lower first features. Individual of the upper second features is directly above and covers at least a portion of individual of the lower first features in a first horizontal area. Individual of the upper second features are not directly above and are not covering any portion of the individual lower first features in a second horizontal area that is horizontally adjacent the first horizontal area.

In some embodiments, a substrate comprises a plurality of integrated-circuit dies having scribe-line area between immediately-adjacent of the dies. An overlay alignment mark is in the scribe-line area and comprises a first series of periodically-horizontally-spaced continuous first lines. A second series of periodically-horizontally-spaced continuous second lines is directly above the first series of the first lines. Individual of the second lines are directly above and cover at least a portion of individual of the first lines in horizontally-spaced areas of the scribe-line area. An intervening horizontal area is between the horizontally-spaced areas. Individual of the second lines are not directly above and are not covering any portion of the individual first lines in the intervening second horizontal area.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming an overlay alignment mark in the fabrication of integrated circuitry, comprising:
   forming a first series of first features on a substrate, the first features being periodically-horizontally-spaced relative to each other along a first horizontal direction, each of the first features extending along a second horizontal direction across a first horizontal area of the substrate and across a second horizontal area of the substrate that is adjacent to the first horizontal area of the substrate; and
   forming a second series of second features above the first series of the first features, the second features being periodically-horizontally-spaced relative to each other along the first direction, a plurality of the second features each being directly above and covering at least a portion of one of the first features in the a first horizontal area of the substrate, an absence of the second features in the second horizontal area of the substrate, a first of the second features being connected to a second of the second features through an interconnect extending in the first direction within the first horizontal area.

2. The method of claim 1 wherein the first series of the first features are formed commonly within one level of the substrate and the second series of the second features are formed commonly within another level of the substrate that is above the one level.

3. The method of claim 1 wherein the first features and the second features have a one-to-one correspondence in the first horizontal area of the substrate.

4. The method of claim 1 wherein the first features and the second features do not have a one-to-one correspondence in the first area of the substrate.

5. The method of claim 1 comprising forming the second features to be continuous lines of a first material and forming the first features to be continuous lines of a second material.

6. The method of claim 5 wherein the first and second materials are both are conductive.

7. The method of claim 5 wherein one of the first material and the second material is conductive and the other is insulative.

8. The method of claim 5 comprising forming the second material into continuous lines of the individual second features by spacer patterning.

9. The method of claim 1 comprising forming the second features and the first features to be in respective straight lines.

10. The method of claim 9 comprising forming both of (a) the second features in their respective straight lines in the first horizontal area, and (b) the first features in their respective straight lines in both the first and second horizontal areas, to be continuous.

11. The method of claim 9 comprising forming at least one of (a) the second features in their respective straight lines, or (b) the first features in their respective straight lines, to be discontinuous.

12. The method of claim 11 comprising forming only one of (a) and (b) to be discontinuous.

13. The method of claim 11 comprising forming both of (a) and (b) to be discontinuous.

14. The method of claim 9 wherein the straight lines of the second features and number of the straight lines of the first features have a one-to-one correspondence.

15. The method of claim 9 wherein the straight lines of the second features and the straight lines of the first features do not have a one-to-one correspondence.

16. The method of claim 1 each of the first series of first features and second series of second features is horizontally elongated.

17. The method of claim 1 wherein the first and second horizontal areas are immediately-horizontally-adjacent one another.

18. The method of claim 1 wherein the second features are never directly above and never covering any portion of the first features in the second horizontal area.

19. The method of claim 1 comprising:
   initially forming the second features to be directly above and covering at least some portion of the first features in the second horizontal area; and
   after said initially forming, removing all of the individual second features in the second horizontal area.

20. The method of claim 1 wherein the substrate comprises a plurality of integrated-circuit dies having scribe-line area between immediately-adjacent of the dies, the overlay alignment mark being formed in the scribe-line area.

21. A method of forming an overlay alignment mark in the fabrication of integrated circuitry, comprising:
   forming a first series of first features on a substrate, the first features being periodically-horizontally-spaced relative to each other along a first horizontal direction, each of the first features extending along a second horizontal direction across a first horizontal area of the substrate and across a second horizontal area of the substrate that is adjacent to the first horizontal area of the substrate;
   forming a second series of second features above the first series of the first features, the second features being periodically-horizontally-spaced relative to each other along the first direction, a first plurality of the second features each being directly above and covering at least a portion of one of the first features in the a first horizontal area of the substrate, with the plurality multiple of the first features being present within the first horizontal area of the substrate, an absence of the second features in the second horizontal area of the substrate; and
   forming a third horizontal area of the substrate that is spaced from the first horizontal area by the second horizontal area, wherein the first features comprised by the first series of first features extend across the third horizontal area of the substrate, and forming a second plurality of the second features directly above and covering at least a portion of the individual first features in the third horizontal area.

22. The method of claim 21 wherein,
   the first and second horizontal areas are immediately-horizontally-adjacent one another; and
   the second and third horizontal areas are immediately-horizontally-adjacent one another.

23. A method of determining overlay alignment in the fabrication of integrated circuitry, comprising:
  forming a first series of first features on a substrate, the first features being periodically-horizontally-spaced along a first horizontal direction relative to each other; and
  forming a second series second features directly above the first series of the first features, the second features being periodically-horizontally-spaced along the first horizontal direction relative to each other, each of the second features being directly above and covering at least a portion of one of the first features in a first horizontal area of the substrate that contains multiple of the first features, the second features not being directly above and not covering any portion of the first features in a second horizontal area of the substrate that is horizontally adjacent the first horizontal area along a second horizontal direction, multiple of the first features being present in the second horizontal area;
  forming an interconnect extending along the first direction within the first horizontal area, the interconnect connecting a first of the second features to a second of the second features; and
  comparing horizontal alignment of the uncovered first features in the first horizontal area and the second features in the horizontally-adjacent second horizontal area relative to one another to determine overlay alignment of the second features relative to the first features.

24. An integrated-circuitry overlay alignment mark, comprising:
  a first series of first features on a substrate, the first features being periodically-horizontally-spaced relative to each other along a first horizontal direction;
  a second series of second features directly above the first series of the first features, the second features being periodically-horizontally-spaced relative to each other along the first horizontal direction, each of the second features being directly above and covering at least a portion of individual one of the first features in a first horizontal area of the substrate that encompasses multiple of the first features, the second features not being directly above and not covering any portion of any of the first features in a second horizontal area of the substrate that is horizontally adjacent the first horizontal area along a second horizontal direction, multiple of the first features being present within the second horizontal area; and
  an interconnect within the first horizontal area, the interconnect extending along the first direction and connecting a first of the second features to a second of the second features.

25. A substrate comprising:
  a plurality of integrated-circuit dies having scribe-line area between immediately-adjacent of the dies; and
  an overlay alignment mark in the scribe-line area, comprising:
    a first series of first features, the first series progressing along a first horizontal direction; and
    a second series of second features directly above the first series features, each of the second features being directly above and covering at least a portion of one of the first features in a first horizontal area that encompasses multiple of the first features, the upper second features being absent in a second horizontal area that is horizontally adjacent the first horizontal area along a second horizontal direction, multiple of the first features being present in the second horizontal direction; and
    a third series of second features directly above the first series of first features, each of the second features in the third series being directly above and covering at least a portion of one of the first features in a third horizontal area that is spaced from the first horizontal area in the second direction, the second horizontal are being between the first horizontal are and the second horizontal area.

* * * * *